(12) United States Patent
Dole et al.

(10) Patent No.: US 12,322,571 B2
(45) Date of Patent: Jun. 3, 2025

(54) MULTI-STATE RF PULSING TO CONTROL MASK SHAPE AND BREAKING SELECTIVITY VERSUS PROCESS MARGIN TRADE-OFF

(71) Applicant: Lam Research Corporation, Fremont, CA (US)

(72) Inventors: Nikhil Dole, Union City, CA (US); Vikhram Vilasur Swaminathan, Redwood City, OR (US); Beibei Jiang, Fremont, CA (US); Merrett Wong, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 321 days.

(21) Appl. No.: 17/634,547

(22) PCT Filed: Aug. 21, 2020

(86) PCT No.: PCT/US2020/047370
§ 371 (c)(1),
(2) Date: Feb. 11, 2022

(87) PCT Pub. No.: WO2021/035132
PCT Pub. Date: Feb. 25, 2021

(65) Prior Publication Data
US 2022/0285130 A1 Sep. 8, 2022

Related U.S. Application Data

(60) Provisional application No. 62/909,781, filed on Oct. 3, 2019, provisional application No. 62/890,285, filed on Aug. 22, 2019.

(51) Int. Cl.
*H01J 37/32* (2006.01)

(52) U.S. Cl.
CPC .. *H01J 37/32146* (2013.01); *H01J 37/32165* (2013.01); *H01J 37/32935* (2013.01); *H01J 2237/3346* (2013.01)

(58) Field of Classification Search
None
See application file for complete search history.

(56) References Cited

U.S. PATENT DOCUMENTS

| 9,767,991 B2 | 9/2017 | Tan et al. | |
|---|---|---|---|
| 2010/0248488 A1* | 9/2010 | Agarwal | H01J 37/32706 438/714 |

(Continued)

OTHER PUBLICATIONS

ISR & Written Opinion PCT/US2020/047370, dated Nov. 30, 2020, 11 pages.

*Primary Examiner* — Allan W. Olsen
(74) *Attorney, Agent, or Firm* — PENILLA IP, APC (57) ABSTRACT

A method for performing an etch process on a substrate in a plasma processing system, including: applying source RF power and bias RF power to an electrode; wherein the source RF power and the bias RF power are pulsed signals that together define a plurality of multi-state pulsed RF cycles, each cycle having a first state, second state, and third state; wherein the first state is defined by the source RF power having a first source RF power level and the bias RF power having a first bias RF power level; wherein the second state is defined by the source RF power and the bias RF power having substantially zero power levels; wherein the third state is defined by the source RF power having a second source RF power level less than the first source RF power level, and the bias RF power having a substantially zero power level.

23 Claims, 12 Drawing Sheets

(56) References Cited

U.S. PATENT DOCUMENTS

| | | |
|---|---|---|
| 2011/0309049 A1 | 12/2011 | Papasouliotis et al. |
| 2012/0270404 A1* | 10/2012 | Bajaj ................. H01L 21/76898 |
| | | 438/700 |
| 2013/0168354 A1* | 7/2013 | Kanarik ............ H01J 37/32082 |
| | | 216/68 |
| 2016/0322201 A1 | 11/2016 | Kanarik |
| 2017/0103873 A1 | 4/2017 | Kawasaki et al. |
| 2017/0330732 A1* | 11/2017 | Valcore, Jr. ....... H01J 37/32082 |
| 2019/0096694 A1 | 3/2019 | Wang et al. |
| 2020/0294771 A1* | 9/2020 | Shimizu ............ H01J 37/32449 |
| 2020/0411286 A1* | 12/2020 | Koshimizu ....... H01J 37/32697 |
| 2022/0059358 A1* | 2/2022 | Ventzek ............ H01J 37/32183 |
| 2023/0005717 A1* | 1/2023 | Dole ................ H01J 37/32165 |
| 2024/0120205 A1* | 4/2024 | Joi ..................... H01L 21/3065 |

* cited by examiner

Level To Level Pulsing

ETCH HAR & SPUTTER
Mask to Neck

Fig. 2B

PROTECT Mask
(Direct ion dep, ion-assisted neutral dep)

Tri-Level Pulsing

High IE / Narrow IADF: S1

ETCH HAR & SPUTTER
Mask to Neck

PROTECT Mask
(Direct ion dep, ion-
assisted neutral dep)

Fig. 4E

Mid-Low IE: S2

OPEN NECK
(more neutral
passivation to bow)

Tri-Level Pulsing

High IE / Narrow IADF: S1

ETCH HAR & SPUTTER
Mask to Neck

Fig. 6D

Mid-Low IE: S2

OPEN NECK
(more neutral
passivation to bow)

PROTECT Mask
(Direct ion dep, ion-
assisted neutral dep)

MULTI-STATE RF PULSING TO CONTROL MASK SHAPE AND BREAKING SELECTIVITY VERSUS PROCESS MARGIN TRADE-OFF

CLAIM OF PRIORITY

This application is a national stage filing of and claims priority, under 35 U.S.C. § 371, to PCT/US2020/047370, filed on Aug. 21, 2020, and titled "MULTI-STATE RF PULSING TO CONTROL MASK SHAPE AND BREAKING SELECTIVITY VERSUS PROCESS MARGIN TRADE-OFF", which claims benefit of and priority under 35 U.S.C. § 119 (e), to Provisional Patent Application No. 62/909,781, filed on Oct. 3, 2019, titled "MULTI-STATE RF PULSING TO CONTROL MASK SHAPE AND BREAKING SELECTIVITY VERSUS PROCESS MARGIN TRADE-OFF", and to Provisional Patent Application No. 62/890,285, filed on Aug. 22, 2019, titled "MULTI-STATE RF PULSING TO CONTROL MASK SHAPE AND BREAKING SELECTIVITY VERSUS PROCESS MARGIN TRADE-OFF", the disclosures of which are incorporated by reference herein in their entirety.

FIELD OF THE INVENTION

Implementations of the present disclosure relate to a multi-state RF pulsing regime to control mask shape and break the selectivity versus process margin trade-off.

DESCRIPTION OF THE RELATED ART

RF pulsing technology has progressed over the last decade from operating in continuous wave mode (CW) to pulsing mode (On-off, level to level) regimes. The advances in two-state RF pulsing have enabled high aspect ratio etch by improving process margin versus etch selectivity, profile bow, critical dimension (CD) and etch rate uniformity. In the current two-state RF pulsing nomenclature, "State1" (or "S1") represents the high bias and source power state, e.g. greater than 1 kW, with ion energy greater than 3 keV, operated at a pressure less than 30 mTorr to obtain narrow IADF. The other state in the pulse, termed "State0" (or "S0"), represents the deposition step with low bias and source power, e.g. less than 1 kW, with ion energy less than 100 eV. State0 mainly provides passivation attributed to different mechanisms such as direct ion deposition and ion activated neutral deposition. A typical pulse repetition rate for operating this 2-state RF pulsing regime is about 100 Hz to 2 kHz.

As device size continues to shrink further and as pitch size is further reduced (e.g. from 100 nm to less than about 60 nm currently), under current pulsing technology it is difficult to break the etch selectivity versus process margin trade-off. Current technology regimes struggle to balance the health of the high aspect ratio etch while maintaining sufficient process margin (e.g. under-etch, not open, capping).

It is in this context that implementations of the disclosure arise.

SUMMARY

Implementations of the present disclosure include methods and systems for a multi-state RF pulsing regime to control mask shape and break the selectivity versus process margin trade-off.

One of the key challenges of high aspect ratio (HAR) contact etch is to maintain adequate process margin while trying to selectively etch the stack as compared to the mask (e.g. Poly). Commonly, the process margin is tied to the shape and magnitude of necking as that establishes the limiting aspect ratio during a HAR process. However, implementations of the present disclosure provide a method of controlling mask (neck) shape and improving upon the selectivity vs. process margin trade-off.

In accordance with implementations of the disclosure, multi-state RF pulsing with an intermediate state based on a source power only regime helps to control the mask shape (trim the neck) without causing undesirable mask faceting. Combining this source power only pulsing regime with traditional two-state on-off pulsing significantly improves the margin versus selectivity trade-off to leverage the benefits of HAR process improvement knobs.

In some implementations, a method for performing an etch process on a substrate in a plasma processing system is provided, including: applying source RF power to an electrode of the plasma processing system; and applying bias RF power to the electrode; wherein the source RF power and the bias RF power are pulsed signals that together define a plurality of multi-state pulsed RF cycles, each cycle having a first state, a second state, and a third state; wherein the first state is defined by the source RF power having a first source RF power level and the bias RF power having a first bias RF power level; wherein the second state is defined by the source RF power having a substantially zero power level and the bias RF power having a substantially zero power level; wherein the third state is defined by the source RF power having a second source RF power level less than the first source RF power level, and the bias RF power having a substantially zero power level.

In some implementations, the first state is configured to effect etching of a feature on a surface of the substrate.

In some implementations, the second state is configured to effect passivation of the feature on the surface of the substrate.

In some implementations, the third state is configured to effect removal of material forming a neck in the feature.

In some implementations, the bias RF power has a frequency less than about 10 MHz.

In some implementations, the source RF power has a frequency greater than about 20 MHz.

In some implementations, the third state has a duration that is approximately one to five times that of a duration of the first state.

In some implementations, the second state has a duration that is approximately equal to a duration of the first state.

In some implementations, the first source RF power level is approximately in the range of 1 to 6 kW; wherein the first bias RF power level is approximately in the range of 5 to 20 kW.

In some implementations, the second source RF power level is approximately in the range of 100 W to 6 kW.

In some implementations, within each cycle, the third state immediately follows the second state.

In some implementations, within each cycle, the second state immediately follows the third state.

In some implementations, controller device is provided, the controller device configured to cause a plasma processing system to perform an etch process on a substrate in said plasma processing system, the method including the following operations: applying source RF power to an electrode of the plasma processing system; and applying bias RF power to the electrode; wherein the source RF power and the bias RF power are pulsed signals that together define a plurality of multi-state pulsed RF cycles, each cycle having a first state, a second state, and a third state; wherein the first state is defined by the source RF power having a first source RF power level and the bias RF power having a first bias RF power level; wherein the second state is defined by the source RF power having a substantially zero power level and the bias RF power having a substantially zero power level; and wherein the third state is defined by the source RF power having a second source RF power level less than the first source RF power level, and the bias RF power having a substantially zero power level.

It will be appreciated that the foregoing represents a summary of certain non-limiting implementations of the disclosure. Additional implementations will be apparent to those skilled in the art in accordance with the scope of the present disclosure.

DETAILED DESCRIPTION

In the following description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations will be described in conjunction with the specific implementations, it will be understood that it is not intended to limit the disclosed implementations.

At present, current state-of-the-art dielectric etch processes rely on implementations of one or two RF regimes supported by on/off or level-to-level RF pulsing to combine the benefits of high vertical etch rate and adequate sidewall passivation. However, in accordance with implementations of the present disclosure, additional regimes are identified that can independently recover or add more margin in the process. Implementations are provided based on such a regime, incorporating a suitable intermediate state based on implementing a multi-state RF pulsing scheme that overcomes fundamental process development limits and barriers in existing etch technologies. The intermediate state is based on preferential trimming of the mask neck polymer in a low ion energy state, to facilitate a more aggressive high energy state (On/High state) and a more polymerizing passivation state (Off/Low state). Introducing such a low ion energy state with source power only helps to control the neck/mask shape. Combining this approach with on-off pulsing instead of level-to-level pulsing drives more polymer deposition on the top of the mask, passivating the top of the mask and controlling mask etch rate. This approach fundamentally enables breaking the trade-off between mask neck/process margin versus selectivity.

Figure 1A:
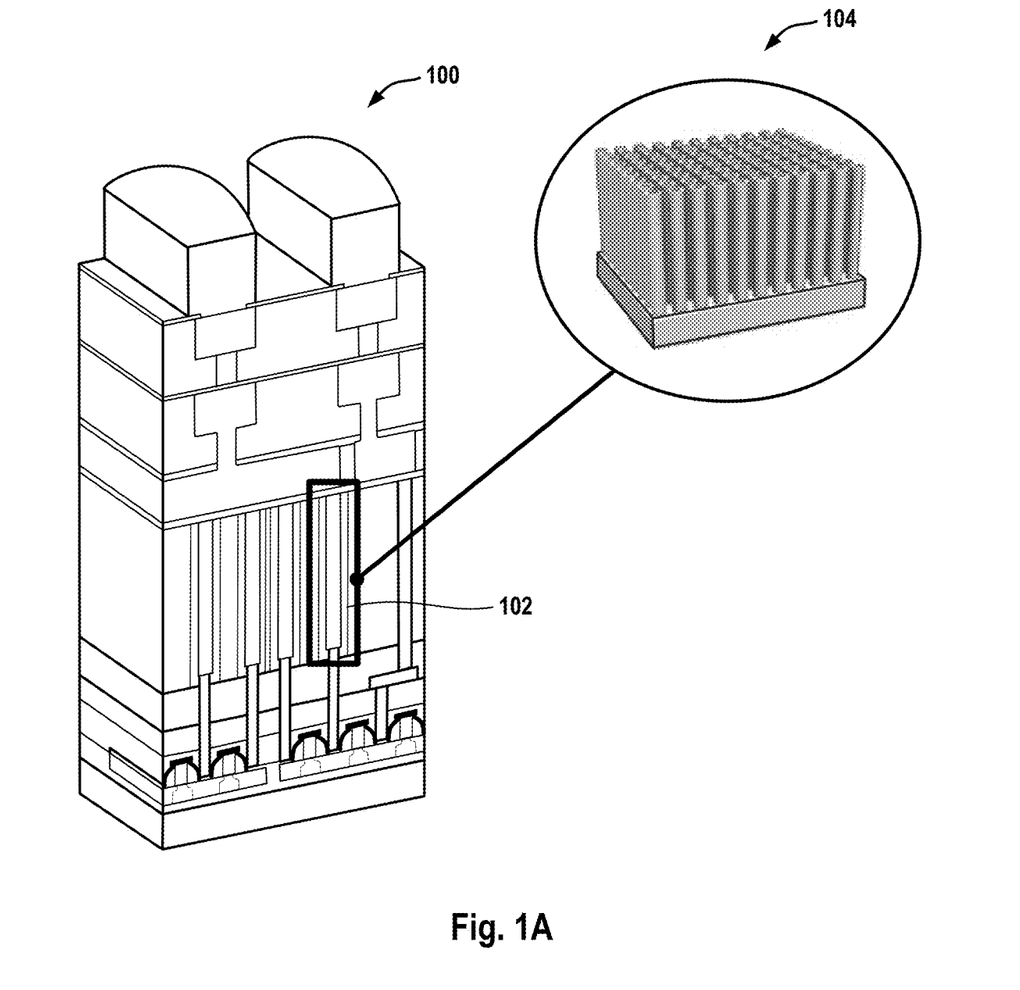
FIG. 1A conceptually illustrates a cutaway perspective view of a typical DRAM device 100, in accordance with implementations of the disclosure.

FIG. 1A conceptually illustrates a cutaway perspective view of a typical DRAM device 100, in accordance with implementations of the disclosure. A typical DRAM device may consist of a 1 to 1.5 micron tall stack, and the manufacture of such DRAM devices includes fabrication of capacitors 102, entailing a capacitor etch process. The capacitor etch is one example of a dielectric etch process requiring suitable etching of very high aspect ratio features (conceptually shown at reference 104), for example on the order of 60 to 100 to one depending on the node. Furthermore, pitch sizes are also scaling smaller and smaller, and as the aspect ratio goes higher and higher, there is less tolerance for defects in the etch process. For capacitor etch, by way of example without limitation, pitch size can be less than 50 nm. It will be appreciated that while implementations of the present disclosure are described with reference to capacitor etch, the principles of the present disclosure can be applied to any high aspect ratio dielectric etch in any applicable device context (e.g. 3D NAND, for example memory hole etch).

Figure 1B:
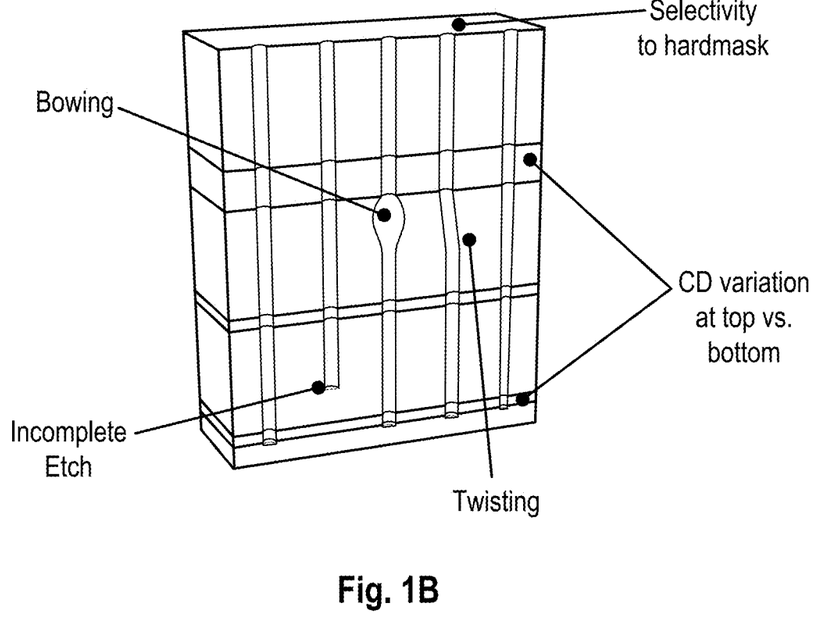
FIG. 1B conceptually illustrates a cutaway perspective view of high aspect ratio etched features, in accordance with implementations of the disclosure.

FIG. 1B conceptually illustrates a cutaway perspective view of high aspect ratio etched features, in accordance with implementations of the disclosure. Further conceptually illustrated are several issues that can arise in high aspect ratio etching, such as in the fabrication context of DRAM capacitors as described above. Problems can include the following: bowing in the feature, in which a portion of the etch profile becomes reentrant; twisting of the feature, in which the etch direction deviates sideways from a straight vertical direction; critical dimension variation from top to bottom, such as the feature being wider at the top than the bottom; incomplete etch, in which the feature fails to be fully etched to reach its desired endpoint; inadequate selectivity to the hardmask, wherein the hardmask is etched, which can cause it to become faceted and exacerbate the problem of bowing.

Thus, in high aspect ratio etching, it is desirable to achieve profile control, to enable etching of a bow-free, straight profile, with minimal twisting and minimizing aspect ratio dependent etch (ARDE). Selectivity to the hardmask is desired, as is avoidance of incomplete etch (under-etch). Moreover, uniformity across the wafer is sought, as well as maintenance of the integrity of the bottom layer.

Figure 2A:
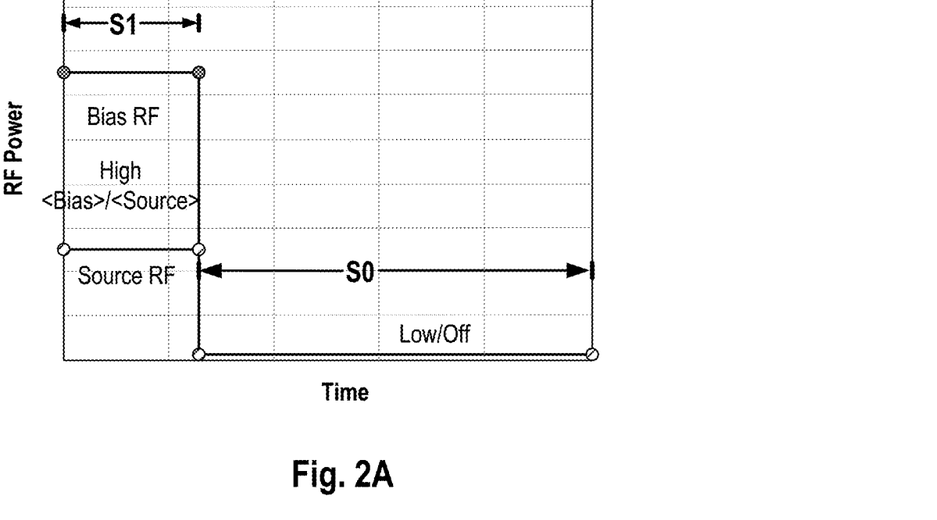
FIG. 2A is a graph of RF power versus time for a single pulsed RF cycle for an etch process, in accordance with implementations of the disclosure.

FIG. 2A is a graph of RF power versus time for a single pulsed RF cycle for an etch process, in accordance with implementations of the disclosure. The bias RF power and source RF power over time during a single pulsed RF cycle are shown. Under current RF pulsing technology, a two-state pulsing regime is employed, using level-to-level or on-off pulsing. In such a two-state pulsing regime, State1 (S1) is a high ion energy producing state, in which the source RF and the bias RF are in high power states, whereas State0 (S0) is a low ion energy producing state, in which the source RF and bias RF are in low power or completely off states. The function of S1 is to etch the dielectric material, as S1 produces high energy ions directed to activate the surface and etch the film. Whereas the main role of S0 is passivation, as S0 is mainly neutral driven, thereby driving passivation in the etched feature, though there can still be some low energy to keep etching.

Figure 2B:
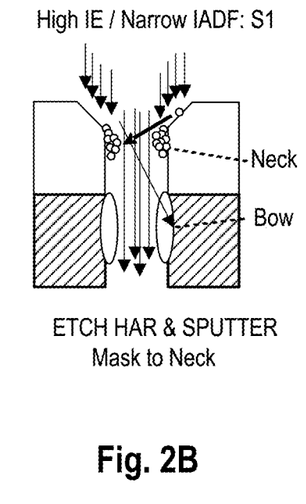
FIGS. 2B and 2C conceptually illustrate cross section views of an etched feature according to the S1 and S0 states, respectively, of the level-to-level pulsing process described above.
Figure 2C:
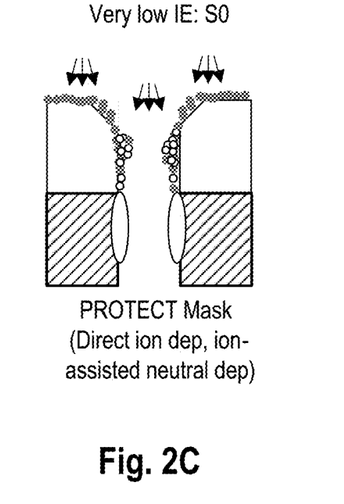

FIGS. 2B and 2C conceptually illustrate cross section views of an etched feature according to the S1 and S0 states, respectively, of the level-to-level pulsing process described above. As shown, S1 primarily enables etching of the high aspect ratio feature, but may also cause sputtering of the mask and formation of a "neck" profile. S0 mainly enables passivation, protecting the mask through direct ion deposition, and ion-assisted neutral deposition.

Thus with level-to-level (L2L) pulsed RF, S1 provides high aspect ratio etch, but also sputters and forms a neck; S0 provides ion-assisted neutral deposition. Yet both cause some amount of necking, and as one moves to higher AR and smaller pitch, opening the neck becomes difficult. With L2L, the tightest critical dimension occurs at the neck, and this tends to throttle the etch when going to very small feature size or pitch size. For example, the neck AR could be almost double the AR of the feature. This also limits the kind of chemistry one can apply and the amount of energization that can be applied into the structure to etch, and so this acts as a limiter in high aspect ratio etch.

Figure 3:
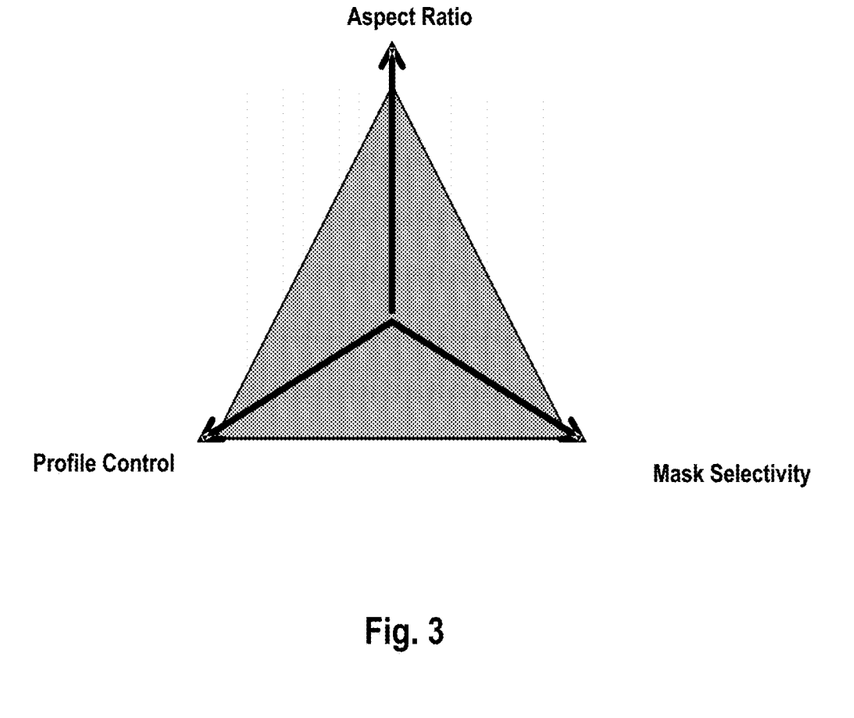
FIG. 3 conceptually illustrates trade-offs in current RF pulsing technology.

FIG. 3 conceptually illustrates trade-offs in current RF pulsing technology. For example, in dielectric high aspect ratio contact etch (e.g. in DRAM & 3DNAND), there are several limitations and constraints when utilizing the current level-to-level RF pulsing regime. Under current level-to-level pulsing, for State1, high power bias (e.g. 400 kHz frequency) would be desirable but is not useable in practice due to hole clogging at high 400 kHz:60 MHz ratio. And chemistry tuning to compensate leads to excessive bow. For State0, low power is used to maintain mask selectivity and bow. Higher power can improve clogging but compromises mask selectivity. Given these constraints, it is difficult to break the tradeoffs in two-state pulsing.

Thus, current technology encounters limits in terms of scaling. As the stack gets taller and taller, the aspect ratio grows, and etch rate declines deeper in features as a function of aspect ratio dependent etch (ARDE). So in order to maintain profile in deeper aspect ratio, typical tradeoff is stack etch rate and due to ARDE. For tighter and tighter pitch, to protect against bowing, high ion energies are used, which facet the mask. Namely, S1 is operated to produce a high ion energy state and it causes mask faceting. On the other hand, in order to reduce costs at lower pitch size, manufacturers wish to reduce the amount of mask material. Given the mask, and stack below, as industry moves to lower and lower pitches, cost reduction is sought by having less mask material. Thus, selectivity to the mask is important. But to improve selectivity at high aspect ratios, the tradeoff is clogging. Holes clog to each other and this causes device failure.

So under current RF pulsing regimes, these tradeoffs are seen, and it is difficult to break the tradeoffs to improve the profile in any one direction.

However, in accordance with implementations of the disclosure, a multi-state RF pulsing regime is introduced with an intermediate state based on a source power only regime. Such a multi-state RF pulsing regime significantly improves the margin versus selectivity trade-off to enable improved etch of high aspect ratio features with suitable profile and mask selectivity.

Figure 4A:
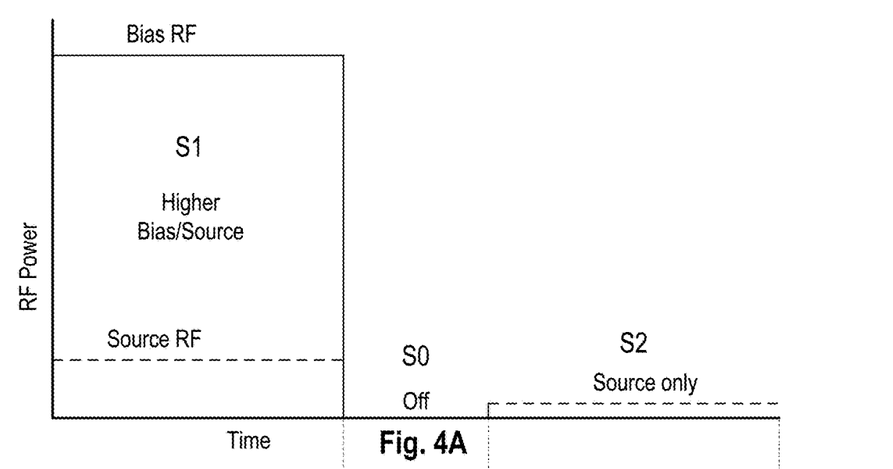
FIGS. 4A, 4B, and 4C conceptually illustrates RF power versus time for a multi-state pulsed RF cycle, in accordance with implementations of the disclosure.
Figure 4B:
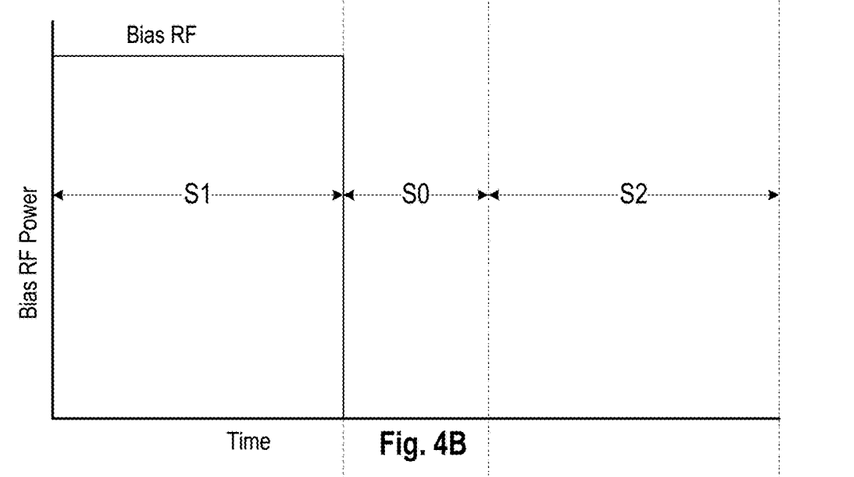
Figure 4C:
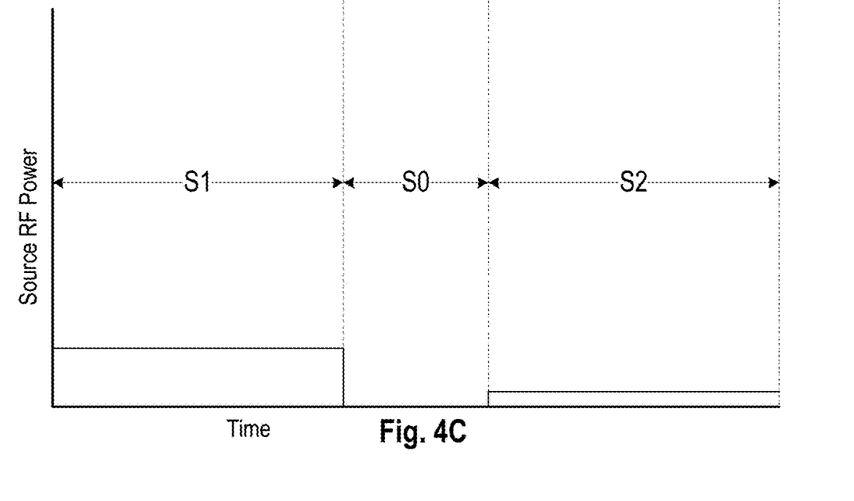
Figure 4D:
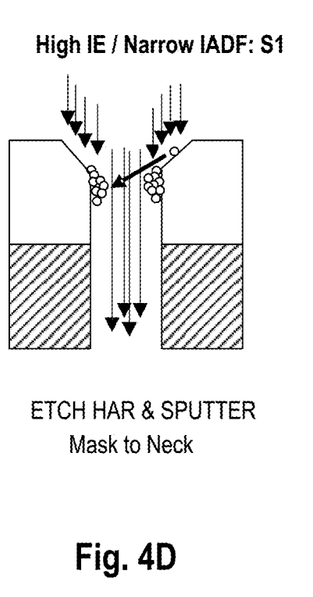
FIGS. 4D, 4E, and 4F conceptually illustrate cross-sections of an etched feature, showing the effects of each state of the herein described multi-state pulsed RF cycle.
Figure 4E:
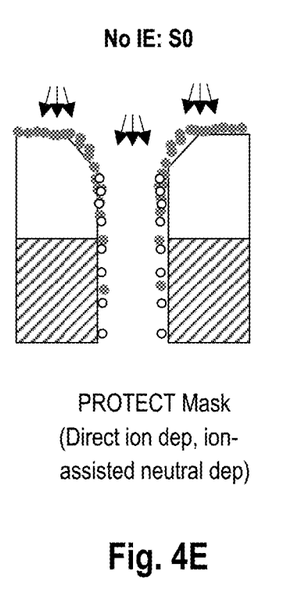
Figure 4F:
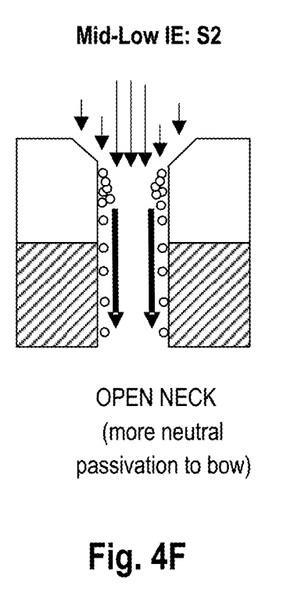

FIGS. 4A, 4B, and 4C conceptually illustrates RF power versus time for a multi-state pulsed RF cycle, in accordance with implementations of the disclosure. FIG. 4A shows both bias RF power and source RF power. For additional clarity, FIG. 4B illustrates the bias RF power over time only, and FIG. 4C illustrates the source RF power over time only. FIGS. 4D, 4E, and 4F conceptually illustrate cross-sections of an etched feature, showing the effects of each state of the herein described multi-state pulsed RF cycle. The pulsed RF cycle can be characterized as a tri-level pulsed RF, employing three distinct states of RF. As shown in the illustrated implementation, S1 is configured to provide high source power and high bias power. As shown in FIG. 4D, this produces high aspect ratio (HAR) etch, but also sputtering of the mask to form a neck. S0 is configured as an off state, with no source or bias power applied. As shown in FIG. 4E, S0 drives more neutral deposition on the top, protecting the mask. In some implementations, S0 is configured to provide direct ion deposition and ion-assisted neutral deposition.

An intermediate state S2 (State2) is configured as a source power only state (e.g. 60 MHz, high frequency), using low source power and zero bias power. As shown in FIG. 4F, S2 helps to induce dissociation, and open the neck by etching whatever neck is formed. So state S2 is configured to open the neck.

Thus, in accordance with implementations of the disclosure, S1 uses high energy ions, which forms a neck, but S2 opens the neck, whereas S0 provides for a lot of passivation. The resulting feature has an open neck, and also has more mask because of more passivation. This addresses the tradeoff problem of neck vs selectivity.

By contrast in a level-to-level RF pulsing regime, in which only 51 and S0 are run, there is a lot of passivation, but there would be a neck, too, which would clog. But with the tri-level RF pulsing regime employing S1, S0, and S2, this provides an open neck and passivation, which breaks tradeoff of selectivity vs cap margin. Broadly speaking, state S0 provides for selectivity, whereas state S2 improves the cap margin.

Generally speaking, in some implementations, the bias power is at a frequency less than about 10 MHz. In some implementations, the bias power is at a frequency of about 400 kHz.

In some implementations, the source power is at a frequency above about 10 MHz. In some implementations, the source power is at a frequency of more than about 20 MHz. In some implementations, the source power is at a frequency of about 60 MHz.

In some implementations, the bias and source frequencies are be applied to the chuck using different generators.

It will be appreciated that in various implementations the specific parameters of the bias and source power, at each of the states, may vary.

In some implementations, the S1 bias power is in the range of about 5 to 20 kW. In some implementations, the S1 source power is in the range of about 1 to 6 kW. In some implementations, either or both of the S1 bias power and the S1 source power may vary over time, for example depending upon the elapsed time of etching within a feature, the current depth of the feature, or the current aspect ratio of the feature. In some implementations, S1 bias power and/or S1 source power are configured to increase as elapsed etch time, depth, or aspect ratio increase.

Generally speaking, it is contemplated that the S0 state is an off state, with both bias power and source power at substantially zero or near-zero levels.

In some implementations, the S2 bias power is substantially zero or near zero. In some implementations, the S2 source power is in the range of about 100 W to 6 kW. In some implementations, the S2 source power may vary over time, for example depending upon the elapsed time of etching within a feature, the current depth of the feature, or the current aspect ratio of the feature. In some implementations, S2 source power is configured to increase as elapsed etch time, depth, or aspect ratio increase.

It will be appreciated that the relative durations of S1, S0, and S2 may also be configured to provide suitable etch profile and etch rates in accordance with implementations of the disclosure. In some implementations, the ratio of the durations of S2 to S1 is in the range of about one to one (1:1) to 5 to one (5:1).

In some implementations, the ratio of the durations of S0 to S1 is approximately one to one (1:1). In some implementations, this ratio can vary.

It will be appreciated that the relative time durations of the various states can be dependent on pitch, depth of etch, and what parameter is to be controlled. For example, for a relatively shallow AR etch, S2 does not need to be very long to open the neck, because in the beginning of the etch, AR does not play as significant a role. However, as the etch deepens and higher AR etching is required, then S2 plays an important role of opening the neck to enable higher aspect ratio etching.

Figure 5:
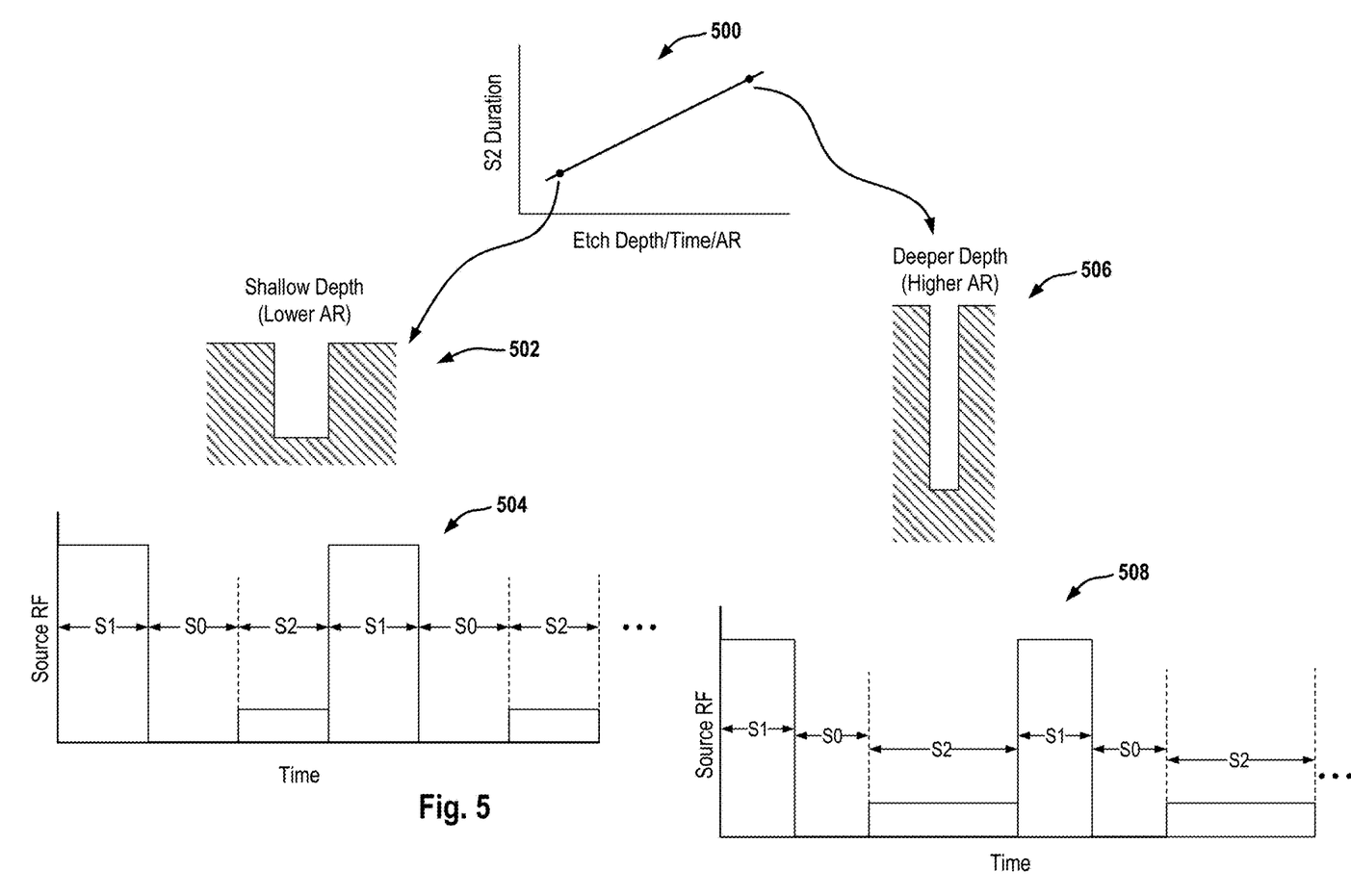
FIG. 5 conceptually illustrates varying the length of state S2 over time during etching of a feature, in accordance with implementations of the disclosure.

FIG. 5 conceptually illustrates varying the length of state S2 over time during etching of a feature, in accordance with implementations of the disclosure. In the illustrated graph 500, S2 duration versus etch depth/time/aspect ratio is shown. As indicated, the duration of S2 increases as the current etch depth within a feature, or the time of etching of the feature, or the current aspect ratio of the feature, increases. By way of example without limitation, when the feature has a relatively shallow depth and consequently lower aspect ratio (as conceptually shown at reference 502), as may be the case earlier in the etching of the feature, then the source RF power profile may look like that shown by the graph 504, with a relatively short duration of S2. By contrast, when the feature has a relatively deep depth and consequently higher aspect ratio (as conceptually shown at reference 506), as may be the case later in the etching of the feature, then the source RF power profile may look like that shown by the graph 504, with a relatively longer duration of S2.

Thus, the higher the aspect ratio, the longer the S2 duration, as the neck-opening step becomes more critical to maintaining the etch profile. The durations of S1, S0, and S1 are all scalable, and there can also be a dependence of S2 on S1 and S0. The source RF power is being configured for removal of neck that is then followed by passivation.

In the above-described implementations, the various states have been run in the order S1-S0-S2 (and repeated).

Broadly speaking, this provides for etching (provided by S1), followed by passivation (provided by S0), followed by neck opening (provided by S2).

However, in other implementations, S2 can occur between S1 and S0, such that the order of the states is S1-S2-S0 (and repeated). This provides for etching (provided by S1), followed by neck opening (provided by S2), followed by passivation (provided by S0).

Figure 6A:
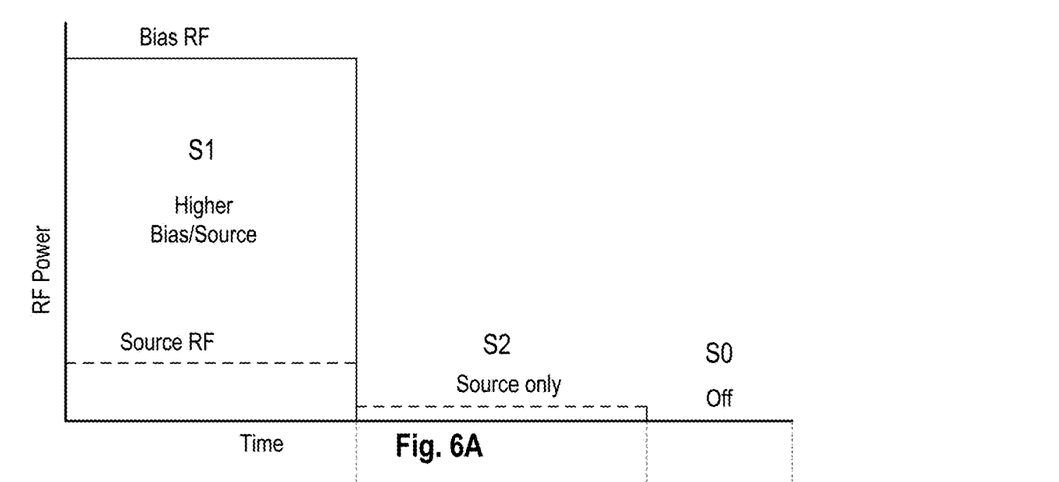
FIGS. 6A, 6B, and 6C illustrate graphs showing RF power versus time for a multi-state RF pulsing cycle, in accordance with implementations of the disclosure.
Figure 6B:
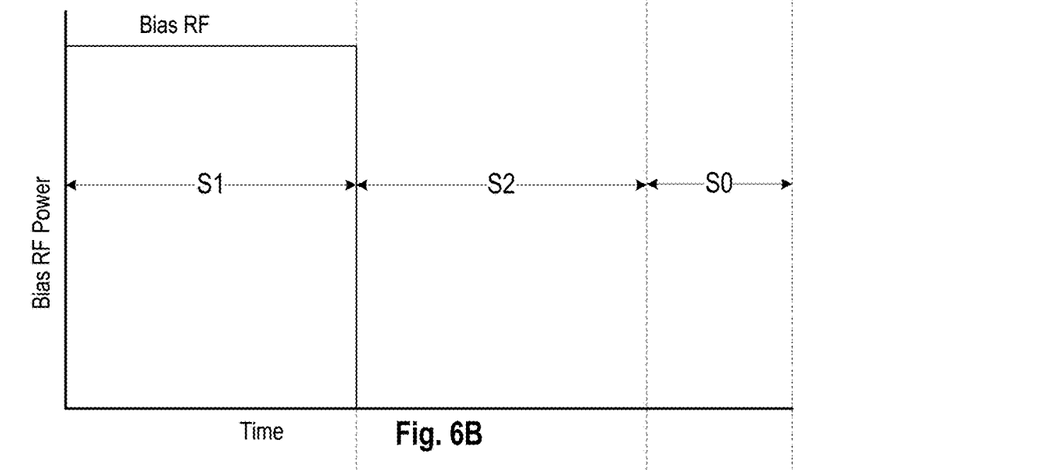
Figure 6C:
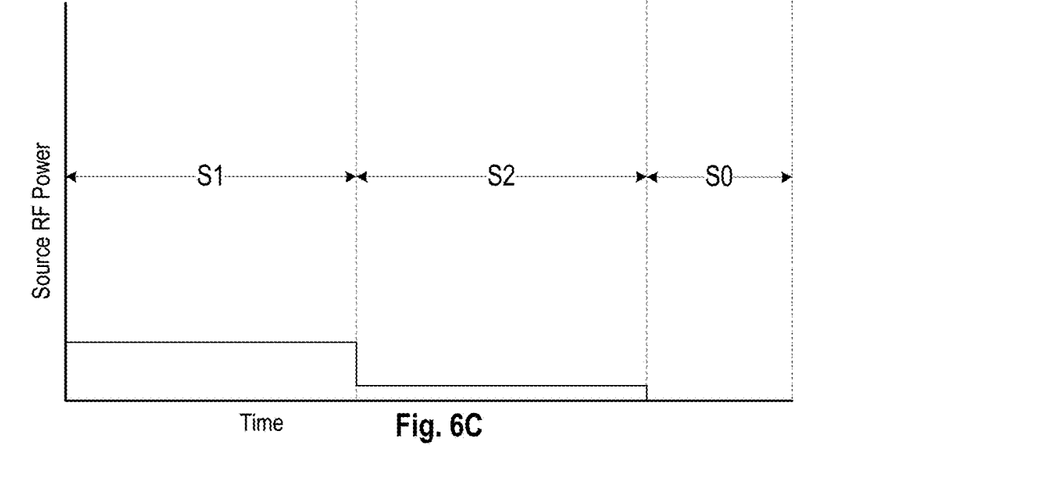

FIGS. 6A, 6B, and 6C illustrate graphs showing RF power versus time for a multi-state RF pulsing cycle, in accordance with implementations of the disclosure. FIG. 6A illustrates both bias RF power and source RF power over time. For further clarity, FIG. 6B illustrates bias RF power over time alone, and FIG. 6C illustrates source RF power over time alone. In the illustrated implementation, the states are run in the order S1-S2-S0. As with implementations previously described, S1 is a high ion energy state, employing high bias power and high source power. S2 is a source power only state, employing substantially zero bias power and a low source power. S0 is an off state, employing substantially zero bias power and substantially zero source power.

Figure 6D:
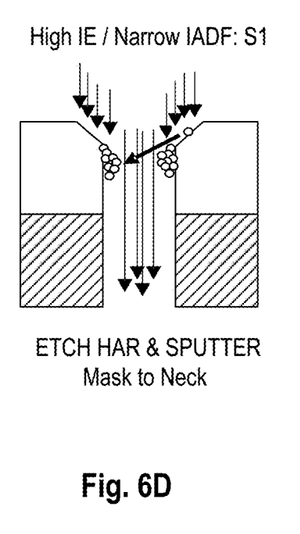
FIGS. 6D, 6E, and 6F conceptually illustrate cross sections an etched feature, demonstrating the effect of the states S1, S2, and S0 in accordance with the implementations of FIGS. 6A, 6B, and 6C.
Figure 6E:
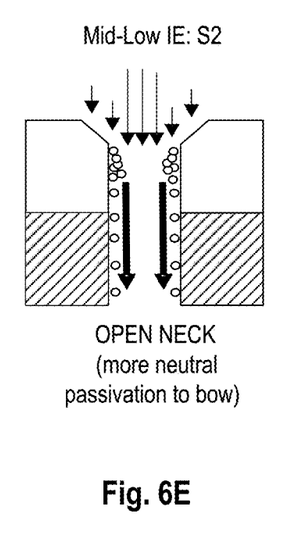
Figure 6F:
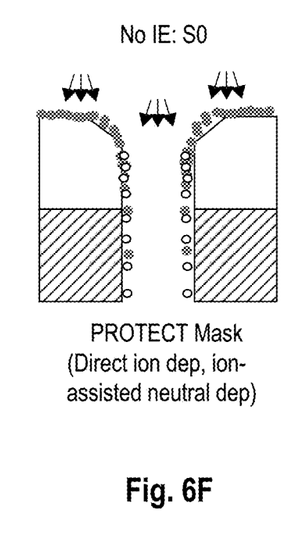

FIGS. 6D, 6E, and 6F conceptually illustrate cross sections of an etched feature, demonstrating the effect of the states S1, S2, and S0 in accordance with the implementations of FIGS. 6A, 6B, and 6C. As shown in FIG. 6D, state 51 generates high ion energy to enable etching of the high aspect ratio feature, but also produces sputtering of the mask and causes a neck to be formed in the feature. As shown in FIG. 6E, state S2 produces mid to low ion energies, which open the neck. As shown in FIG. 6F, state S0 protects the mask by enabling direct ion deposition and ion-assisted neutral deposition.

Implementations of the present disclosure are applicable to dielectric etch. In some implementations, fluorine based chemistry is employed, e.g. fluorocarbon, hydrofluorocarbon, etc.

When the RF pulsing regime began, it was operated as on-off pulsing (S1S0). However, this puts a lot of passivation, and therefore, industry went to level-to-level pulsing, in which some power is put in S0. But this causes loss of the benefit of having more selectivity, because putting more power introduces ions that sputter off the passivation. But with the tri-level multistate RF pulsing provided herein, a new source only state is used, which opens the neck, while passivation is still used. This breaks the traditional process tradeoff of selectivity versus neck.

Figure 7:
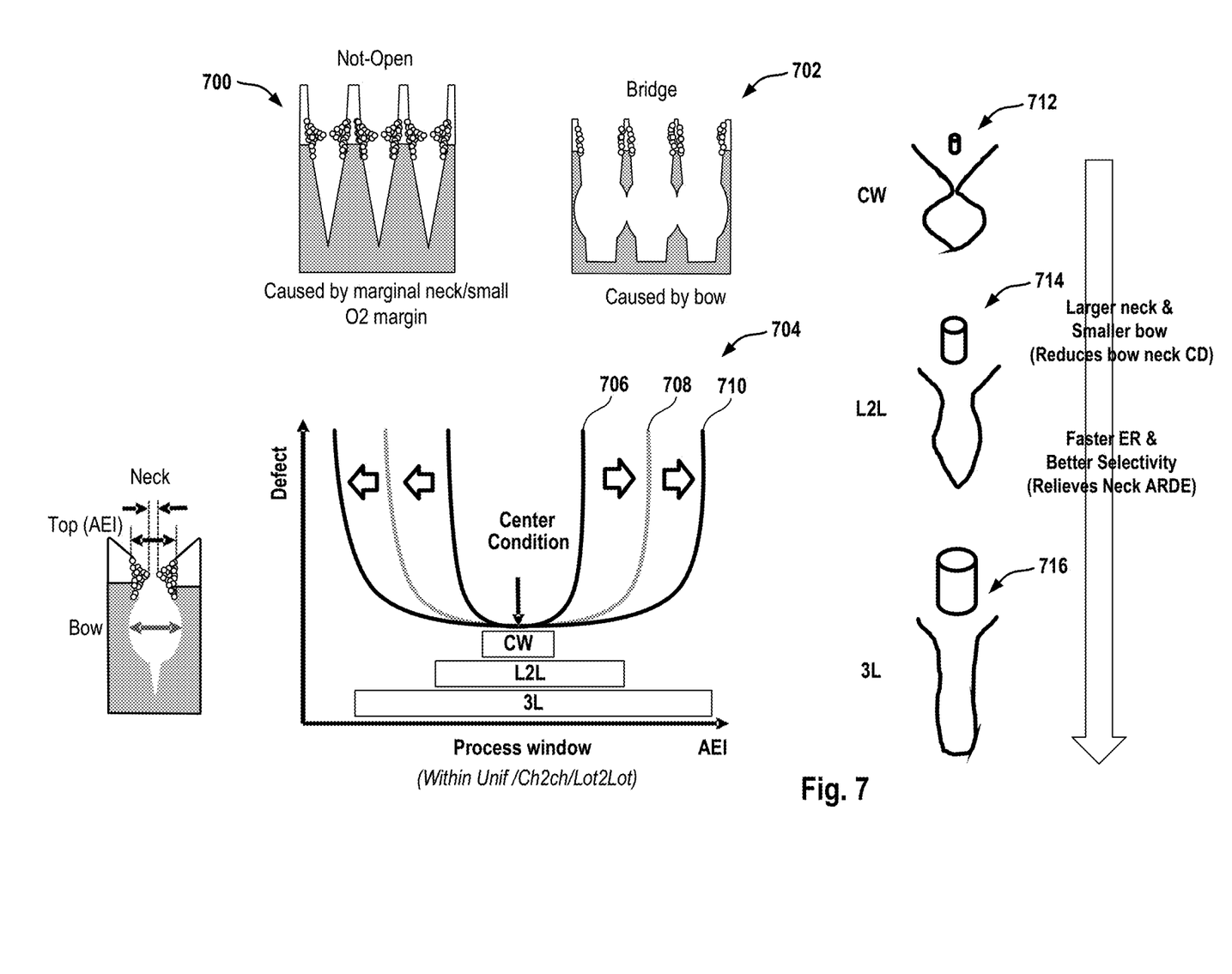
FIG. 7 conceptually illustrates the expansion of the process window by using the multi-state RF pulsing regime described herein.

FIG. 7 conceptually illustrates the expansion of the process window by using the multi-state RF pulsing regime described herein. In particular, there is a tradeoff between the not-open margin and bridging. A not-open state is shown at reference 700, in which HAR etching fails due to the buildup of the neck at the feature opening. However, the trade-off against a not-open state is bowing of the feature, and possibly leading to bridging of features with each other, creating open contacts that cause device failure. Thus, a process window between the not-open and bridging states exists, but becomes narrower as the CD/pitch size is reduced with each new/advanced tech node. Thus, a key process goal is achieving bow reduction without sacrificing not-open margin, in order to extend high aspect ratio contact etch capability. Improvement of the not-open margin due to smaller neck/large capping margin is sought; and improvement of a bridge margin for bow reduction is also sought.

A graph 704 shows a plot of defect vs. after-etch inspection, showing the process window under continuous wave (ref. 706), level to level (ref. 708), and the presently described tri-level (ref. 710) RF pulsing regimes.

From earlier continuous wave (CW) regimes, as pitch size decreased, technology moved to level-to-level pulsing, where pulsing went between etch and passivation states, which improved the process window for high aspect ratio etch. But now technology has advanced to a point where pitch size dominates how well one can etch into high aspect ratio features. As shown, the tri-level RF pulsing regime introduced herein further broadens the window for process operation, thereby enabling etching without device failure. As can be seen, the process window is now wider and it becomes possible to control defects within this window.

As described, clogging can occur when there is too much polymer on the neck and the feature opening clogs, or bridging can occur by bowing being so large that the holes bridge into one (resulting in an open contact). Under the continuous wave mode, a profile as shown at reference 712 may be seen, which predominantly clogs the neck. Under the level-to-level mode, a profile as shown at reference 714 is provided, where there is a larger neck and smaller bow, so clogging is controlled but process window is pretty short. But with tri-level pulsing in accordance with implementations of the disclosure, the profile as shown at reference 716, provides a much wider open neck, and even better process window. Faster etch rates and better selectivity are possible, as neck ARDE is relieved.

Another benefit is that the tri-level RF pulsing regime enables a wider choice of chemistry. While it would normally be difficult to introduce new chemistries as pitch sizes are getting smaller, providing wider process window opens not only the RF regime but also opens the chemistry regime, enabling application of more passivating chemistries to passivate the sidewall.

Figure 8:
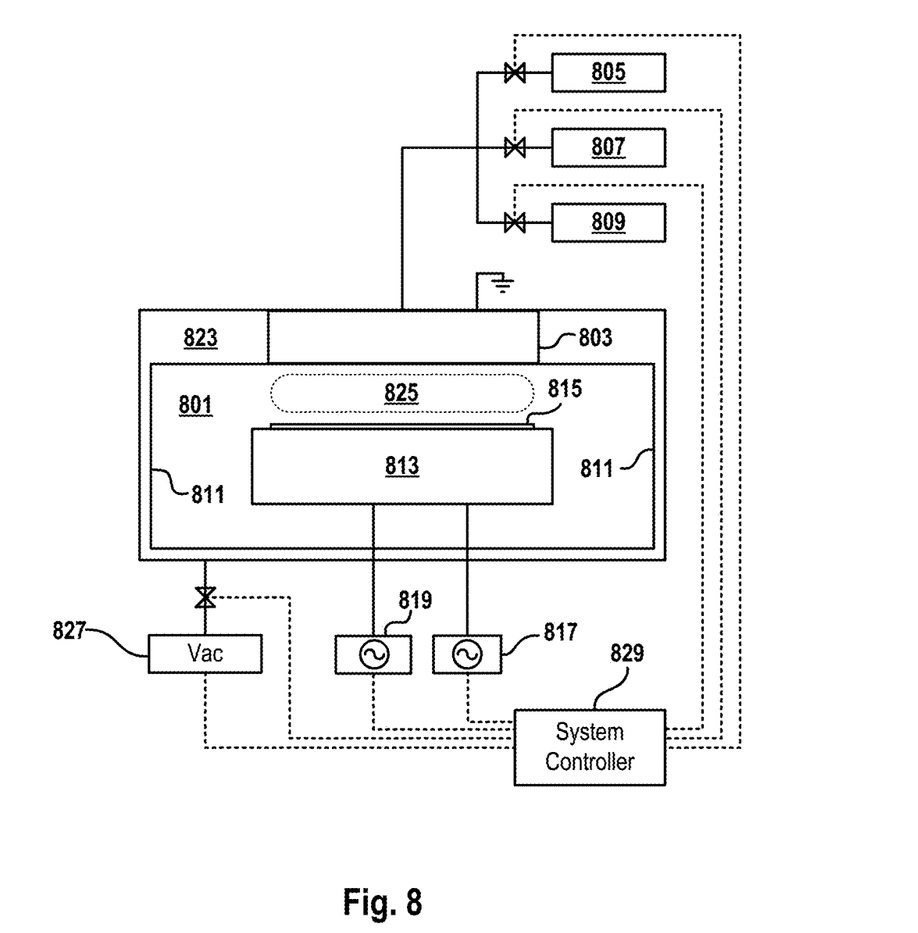
FIG. 8 illustrates an example ICP deposition system, in accordance with implementations of the disclosure.

Various implementations described herein may be performed in a plasma processing system. With reference to FIG. 8, an example plasma processing system or apparatus may include a chamber 801 having a gas injector/showerhead/nozzle 803 for distributing gases (805, 807, 809) (e.g. reactant and purge gases) or other chemistries into the chamber 801, chamber walls 811, a chuck 813 for holding a substrate or wafer 815 to be processed which may include electrostatic electrodes for chucking and dechucking a wafer. The chuck 813 is heated for thermal control, enabling heating of the substrate 815 to a desired temperature. In some implementations, the chuck 813 may be electrically charged using an RF power supply 817 to provide a bias voltage in accordance with implementations of the disclosure.

A source RF power supply 819 is configured to supply source RF power to an electrode in the chuck 813 to generate a plasma 825 in the process space over the substrate 815. In some implementations, the chamber walls are heated to support thermal management and efficiency. A vacuum source 827 provides a vacuum to evacuate gases from the chamber 801. The system or apparatus may include a system controller 829 for controlling some or all of the operations of the chamber or apparatus such as modulating the chamber pressure, inert gas flow, plasma source power, plasma source frequency, reactive gas flow; bias power, bias frequency, temperature, vacuum settings; and other process conditions.

In some implementations, a system/apparatus may include more than one chamber for processing substrates.

Figure 9:
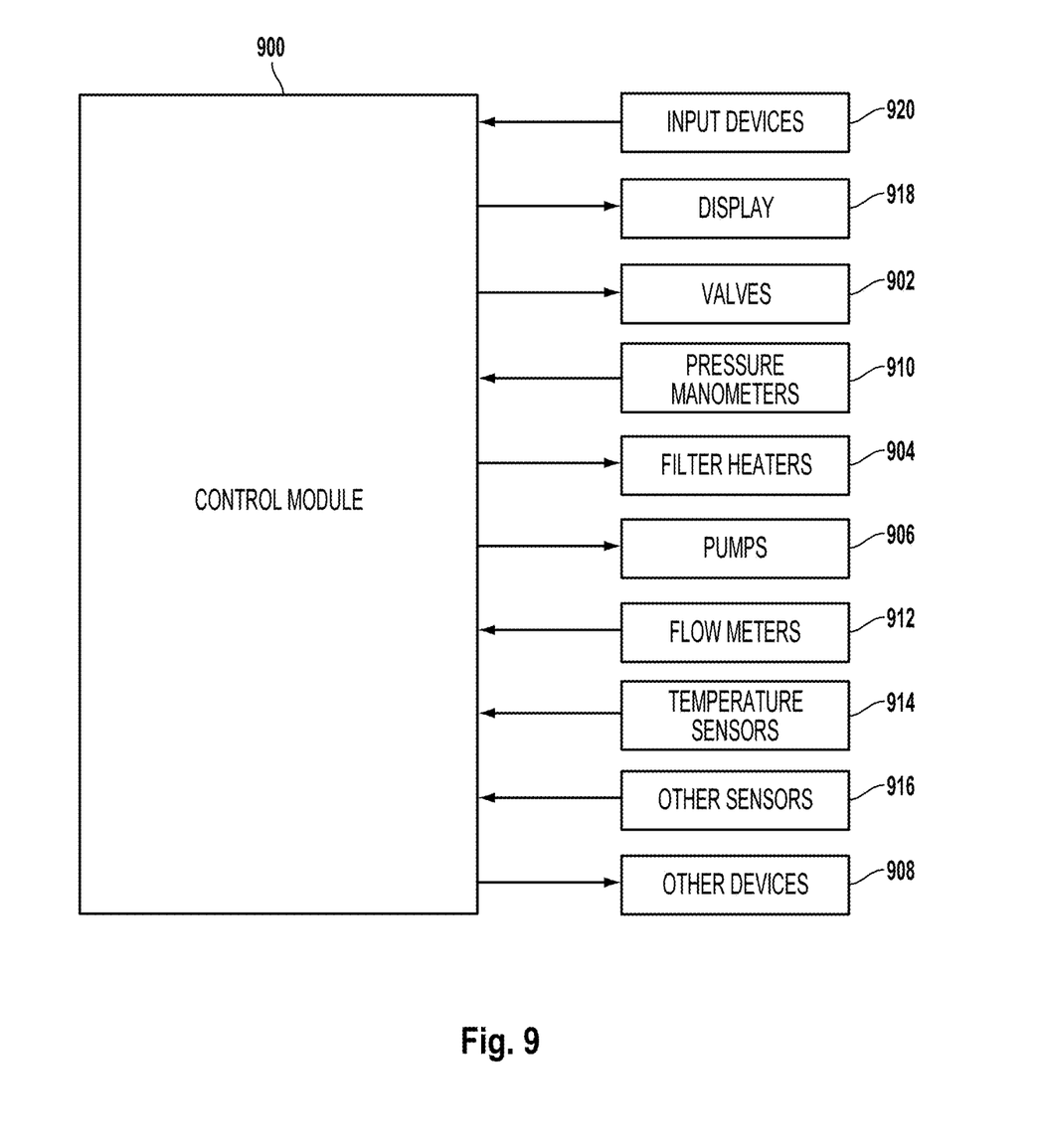
FIG. 9 shows a control module for controlling the systems described above, in accordance with implementations of the disclosure.

FIG. 9 shows a control module 900 for controlling the systems described above, in accordance with implementations of the disclosure. For instance, the control module 900 may include a processor, memory and one or more interfaces. The control module 900 may be employed to control devices in the system based in part on sensed values. For example, the control module 900 may control one or more of valves 902, filter heaters 904, pumps 906, and other devices 908 based on the sensed values and other control parameters. The control module 900 receives the sensed values from, for example only, pressure manometers 910, flow meters 912, temperature sensors 914, and/or other sensors 916. The control module 900 may also be employed to control process conditions during reactant delivery and plasma processing. The control module 900 will typically include one or more memory devices and one or more processors.

The control module 900 may control activities of the reactant delivery system and plasma processing apparatus. The control module 900 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 900 may also monitor the pressure differential and automatically switch vapor reactant delivery from one or more paths to one or more other paths. Other computer programs stored on memory devices associated with the control module 900 may be employed in some implementations.

Typically there will be a user interface associated with the control module 900. The user interface may include a display 918 (e.g. a display screen and/or graphical software displays of the apparatus and/or process conditions), and user input devices 920 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing implementations have been described in some detail for purposes of clarity of understanding, it will be apparent that certain changes and modifications may be practiced within the scope of the disclosed implementations. It should be noted that there are many alternative ways of implementing the processes, systems, and apparatus of the present implementations. Accordingly, the present implementations are to be considered as illustrative and not restrictive, and the implementations are not to be limited to the details given herein.

The invention claimed is:

1. A method for performing an etch process on a substrate in a plasma processing system, comprising:

applying source RF power to an electrode of the plasma processing system; and applying bias RF power to the electrode;

wherein the source RF power and the bias RF power are pulsed signals that together define a plurality of multi-state pulsed RF cycles, each cycle having a first state, a second state, and a third state;

wherein the first state is defined by the source RF power having a first source RF power level and the bias RF power having a first bias RF power level;

wherein the second state is defined by the source RF power having a zero power level and the bias RF power having a zero power level;

wherein the third state is defined by the source RF power having a second source RF power level less than the first source RF power level to effect an energy state defined to assist in removal of material from a neck of a feature being etched with selectivity to a mask, and the bias RF power having a zero power level during said third state, and wherein duration of each of the first state, the second state and the third state are scalable based on aspect ratio of the feature being etched.

2. The method of claim 1, wherein the first state is configured to effect etching of the feature on a surface of the substrate.

3. The method of claim 2, wherein the second state is configured to effect passivation of the feature on the surface of the substrate.

4. The method of claim 1, wherein the bias RF power has a frequency less than about 10 MHZ.

5. The method of claim 1, wherein the source RF power has a frequency greater than about 20 MHz.

6. The method of claim 1, wherein the third state has a duration that is approximately one to five times that of a duration of the first state.

7. The method of claim 1, wherein the second state has a duration that is approximately equal to a duration of the first state.

8. The method of claim 1,
wherein the first source RF power level is approximately in the range of 1 to 6 kW; and
wherein the first bias RF power level is approximately in the range of 5 to 20 kW.

9. The method of claim 1, wherein the second source RF power level is approximately in the range of 100 W to 6 kW.

10. The method of claim 1, wherein within each cycle, the third state immediately follows the second state.

11. The method of claim 1, wherein within each cycle, the second state immediately follows the third state.

12. A method for performing an etch process on a substrate in a plasma processing system, comprising:
applying source RF power to an electrode of the plasma processing system; and
applying bias RF power to the electrode, wherein the bias RF power has a frequency less than about 10 MHZ;
wherein the source RF power and the bias RF power are pulsed signals that together define a plurality of multi-state pulsed RF cycles, each cycle having a first state, a second state, and a third state;
wherein the first state is defined by the source RF power having a first source RF power level and the bias RF power having a first bias RF power level;
wherein the second state is defined by the source RF power having a zero power level and the bias RF power having a zero power level;
wherein the third state is defined by the source RF power having a second source RF power level less than the first source RF power level, and the bias RF power having a zero power level, and
wherein duration of each of the first state, the second state and the third state are scalable based on aspect ratio of the feature being etched.

13. The method of claim 12, wherein the source RF power has a frequency greater than about 20 MHz.

14. The method of claim 12, wherein the third state has a duration that is approximately one to five times that of a duration of the first state.

15. The method of claim 12, wherein the second state has a duration that is approximately equal to a duration of the first state.

16. The method of claim 12, wherein within each cycle, the third state immediately follows the second state.

17. The method of claim 12, wherein within each cycle, the second state immediately follows the third state.

18. A method for performing an etch process on a substrate in a plasma processing system, comprising:
applying source RF power to an electrode of the plasma processing system; and
applying bias RF power to the electrode;
wherein the source RF power and the bias RF power are pulsed signals that together define a plurality of multi-state pulsed RF cycles, each cycle having a first state, a second state, and a third state;
wherein the first state is defined by the source RF power having a first source RF power level and the bias RF power having a first bias RF power level, wherein the first source RF power level is approximately in the range of 1 to 6 kW, and wherein the first bias RF power level is approximately in the range of 5 to 20 kW;
wherein the second state is defined by the source RF power having a zero power level and the bias RF power having a zero power level;
wherein the third state is defined by the source RF power having a second source RF power level less than the first source RF power level, and the bias RF power having a zero power level, and
wherein duration of each of the first state, the second state, and the third state are scalable based on aspect ratio of the feature being etched.

19. The method of claim 18, wherein the second source RF power level is approximately in the range of 100 W to 6 kW.

20. The method of claim 18, wherein the third state has a duration that is approximately one to five times that of a duration of the first state.

21. The method of claim 18, wherein the second state has a duration that is approximately equal to a duration of the first state.

22. The method of claim 18, wherein within each cycle, the third state immediately follows the second state.

23. The method of claim 18, wherein within each cycle, the second state immediately follows the third state.

* * * * *